(12) United States Patent
Takahashi et al.

(10) Patent No.: US 7,474,038 B2
(45) Date of Patent: Jan. 6, 2009

(54) PIEZOELECTRIC ACTUATOR, AND CARRIER AND SHAKE CORRECTION APPARATUS EACH USING THE ACTUATOR

(75) Inventors: Hiroki Takahashi, Ome (JP); Takahiro Mizushina, Kawagoe (JP)

(73) Assignee: Casio Computer Co., Ltd., Tokyo (JP)

( * ) Notice: Subject to any disclaimer, the term of this patent is extended or adjusted under 35 U.S.C. 154(b) by 96 days.

(21) Appl. No.: 11/731,209

(22) Filed: Mar. 29, 2007

(65) Prior Publication Data

US 2007/0228886 A1  Oct. 4, 2007

(30) Foreign Application Priority Data

Mar. 31, 2006 (JP) .............................. 2006-100183

(51) Int. Cl.
*H01L 41/08* (2006.01)
(52) U.S. Cl. ................................. 310/323.02
(58) Field of Classification Search ............ 310/323.02, 310/330–332, 328
See application file for complete search history.

(56) References Cited

U.S. PATENT DOCUMENTS 6,072,266 A * 6/2000 Tomikawa ............. 310/323.02
6,707,232 B2 * 3/2004 Iino et al. .............. 310/323.02
6,765,335 B2 * 7/2004 Wischnewskiy ....... 310/323.02
7,081,700 B2 * 7/2006 Okumura et al. ....... 310/323.17
7,109,639 B2 * 9/2006 Yamamoto et al. ..... 310/323.16
7,187,104 B2 * 3/2007 Yamamoto et al. ..... 310/323.02
7,233,096 B2 * 6/2007 Maruyama et al. ..... 310/323.02

FOREIGN PATENT DOCUMENTS

JP  07-274556 A  10/1995

* cited by examiner

*Primary Examiner*—Mark Budd
(74) *Attorney, Agent, or Firm*—Frishauf, Holtz, Goodman & Chick, P.C.

(57) ABSTRACT

A piezoelectric actuator comprising an elastic plate 2 with a projection 3 provided on one of both surfaces of the plate. A first pair of strip-like piezoelectric elements 120a, 120b are fixed to the other of both the surfaces of the plate such that each of the first pair of piezoelectric elements is disposed along a first straight line passing through the position of the projection on a respective one of its opposite sides. A second pair of strip-like piezoelectric elements 122a, 122b are fixed to the same surface of the plate as the first pair of piezoelectric elements 120a, 120b such that each of the second pair of piezoelectric elements is disposed along a second straight line passing through the position of the projection perpendicular to the first straight line on a respective one of opposite sides of the position of the projection. Voltages are arranged to be applied to the respective piezoelectric elements of the first and second pairs as required so as to deform the plate, thereby causing the projection to deviate.

13 Claims, 16 Drawing Sheets

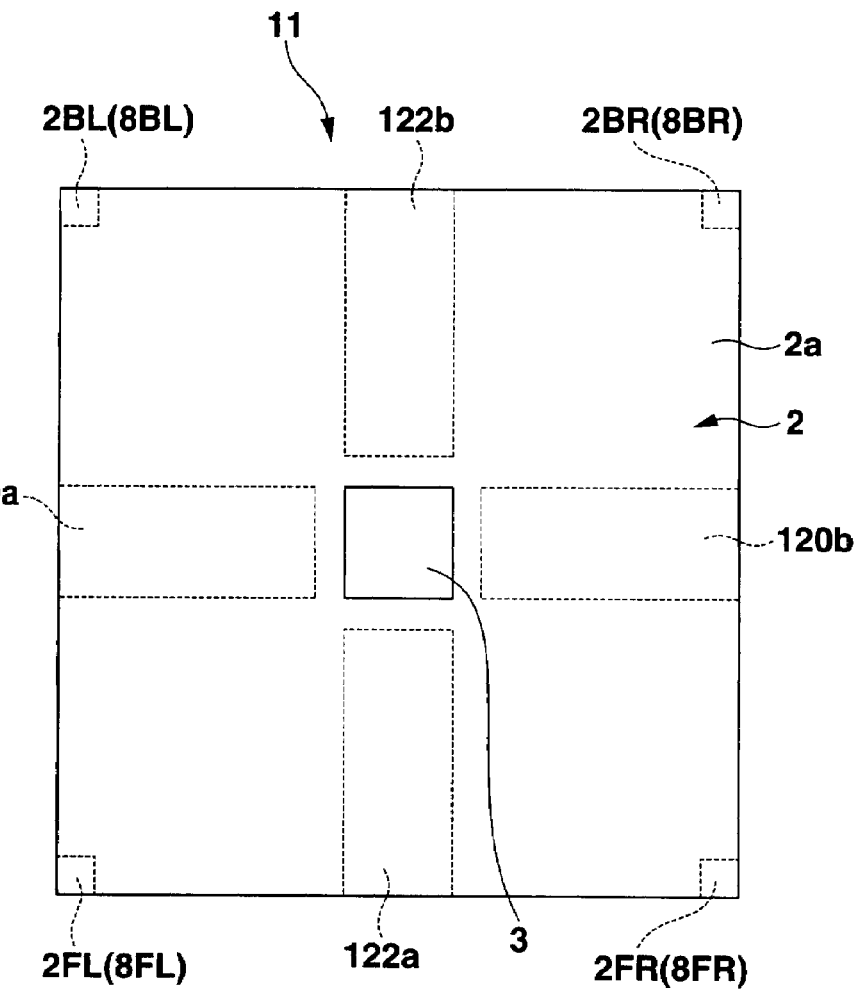
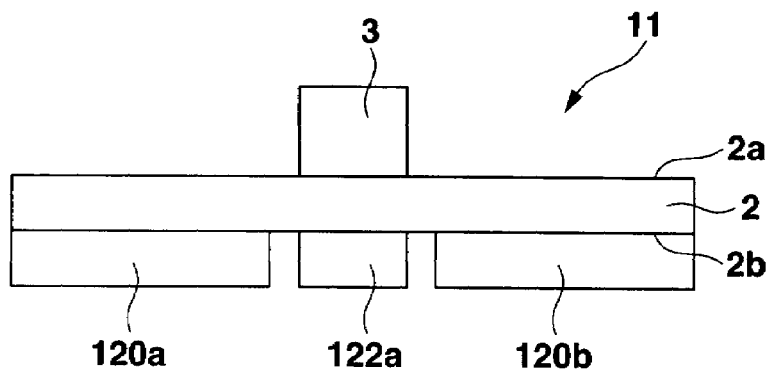

4a →

| | A | B |
|---|---|---|
| (1) | 0 | 0 |
| (2) | − | − |
| (3) | − | + |
| (4) | + | + |
| (5) | + | − |
| (6) | − | − |

| | C | D |
|---|---|---|
| (11) | 0 | 0 |
| (12) | − | − |
| (13) | − | + |
| (14) | + | + |
| (15) | + | − |
| (16) | − | − |

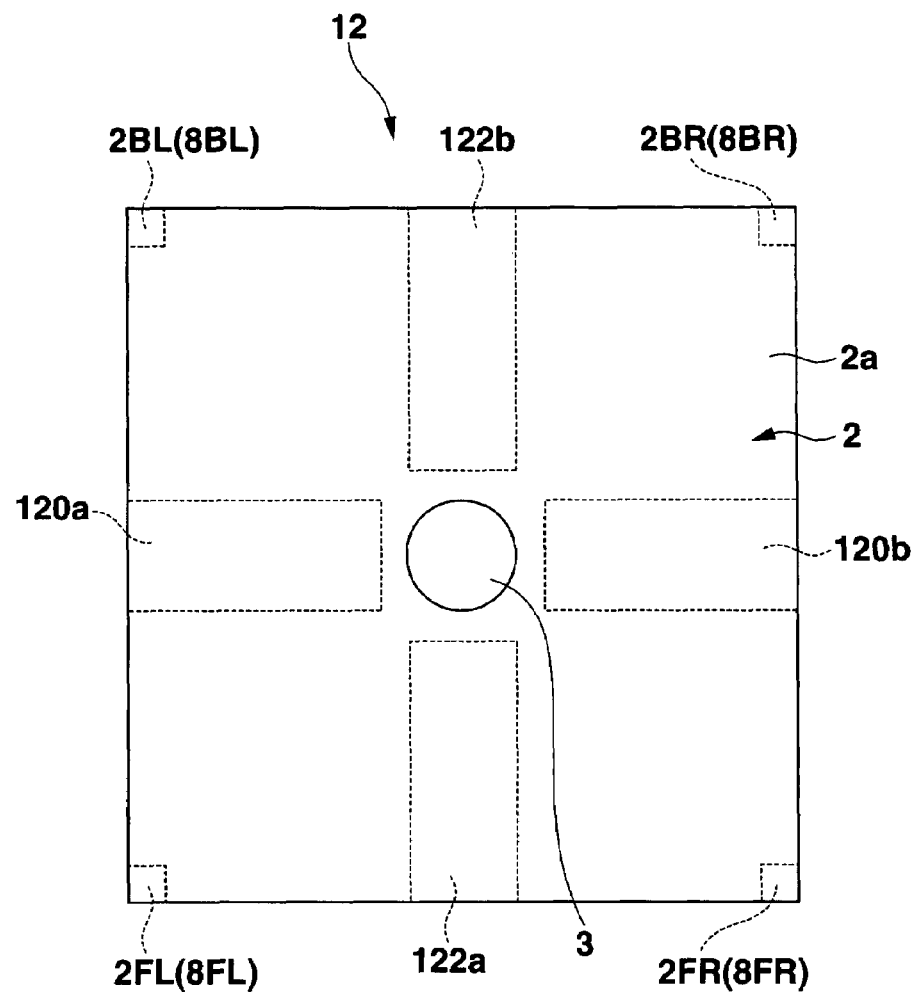
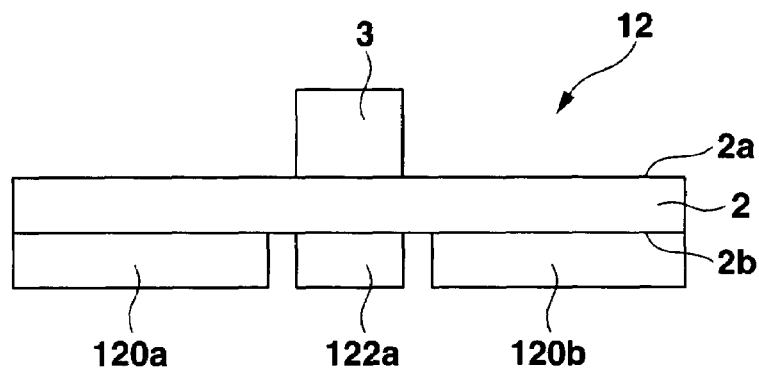

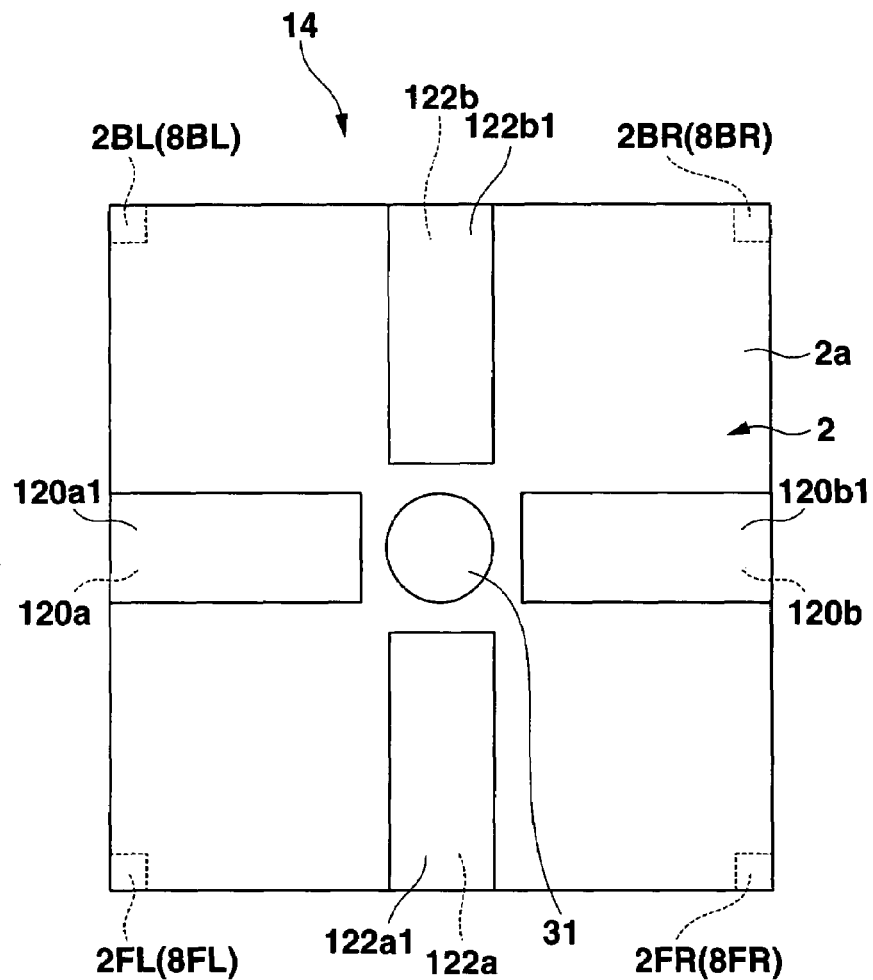
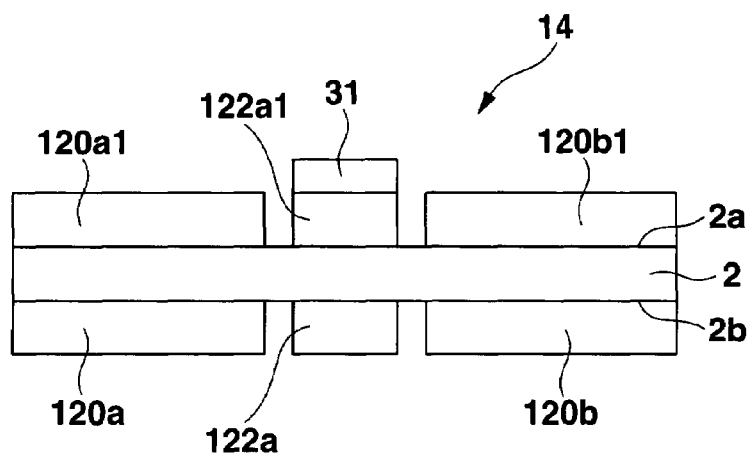

PIEZOELECTRIC ACTUATOR, AND CARRIER AND SHAKE CORRECTION APPARATUS EACH USING THE ACTUATOR

BACKGROUND OF THE INVENTION

1. Field of the Invention

The present invention relates to piezoelectric actuators that convert electric signal to a mechanical output, and carriers and shake correction apparatus in cameras that use the actuator.

2. Background Art

Conventional piezoelectric actuators comprise an elastic column, a projection provided at the center of a front surface of the column, a first pair of piezoelectric elements each bonded to the front surface of the column on a respective one of opposite sides of the projection and a second pair of piezoelectric elements each bonded to a back surface of the column so as to correspond in position to the first pair of piezoelectric elements. When prescribed different voltages are applied across the respective piezoelectric elements, these piezoelectric element extend or contract, thereby deforming the column, which causes the projection to deviate in vertical and horizontal planes, thereby moving an object of interest in corresponding desired directions, for example, as disclosed in Unexamined Japanese Patent Publication 7-274556.

The arrangement of the first and second pairs of piezoelectric elements on the elastic column allows the projection to deviate only in horizontal directions in a plane which intersects with the projection when no voltages are applied to the first and second pairs of piezoelectric elements.

It is therefore an object of the present invention to provide a piezoelectric actuator enabling the projection to deviate in any directions in a plane which intersects with the projection.

SUMMARY OF THE INVENTION

In order to achieve the above object, the present invention provides a piezoelectric actuator comprising: an elastic plate; a projection provided on one of both surfaces of the plate; a first pair of strip-like piezoelectric elements fixed to at least one of both the surfaces of the plate so as to extend along a first straight line passing through the position of the projection on the plate such that each of the first pair of piezoelectric elements is disposed on a respective one of opposite sides of the position of the projection; and a second pair of strip-like piezoelectric elements disposed so as to extend along a second straight line perpendicular to the first straight line, whereby voltages are applied to the respective piezoelectric elements of the first and second pairs so as to deform the plate, thereby causing the projection to deviate.

According to the actuator, when voltages are applied to the first pair of piezoelectric elements, these respective elements are extended and/or contracted, thereby deviating the projection in a first direction in a plane which intersects with the projection. When voltages are applied to the second pair of piezoelectric elements, these respective elements are extended and/or contracted, thereby causing the projection to deviate in a second direction perpendicular to the first direction in the plane. A combination of deviations of the projection in the first and second directions enables the projection to deviate in any directions in the plane.

The plate may be made of a metal.

The first and second pairs of piezoelectric elements may be bonded by a conductive adhesive to the metal plate.

The first and second pairs of strip-like piezoelectric elements may be disposed on the other of both the surfaces of the plate.

The first and second pairs of strip-like piezoelectric elements may be disposed on the one of both the surfaces of the plate on which the projection is provided.

The projection may have a square cross section.

The projection may have a circular cross section.

When the piezoelectric elements of the first and second pairs are fixed to each of both the surfaces of the plate, the piezoelectric elements of the first and second pairs fixed to the one surface of the plate may correspond in position and arrangement to the piezoelectric elements of the first and second pairs fixed to the other surface of the plate.

Each of the piezoelectric elements of the first and second pairs fixed to the one surface of the plate may be arranged so as to have the same polarity as a corresponding one of the piezoelectric elements of the first and second pairs fixed to the other surface of the plate.

The plate may have an opening.

The opening may be provided in the plate between adjacent ones of the piezoelectric elements of the first and second pairs.

The present invention also provides a carrier comprising the actuator and a conveyance member to be conveyed depending on a deviation of the projection.

The present invention also provides a shake correction apparatus in a camera, comprising the actuator and an image capturing unit that is driven depending on a deviation of the projection.

BRIEF DESCRIPTION OF THE DRAWINGS

The above and other objects, features and advantages of the present invention will become apparent in the following detailed description of the present embodiment and modifications thereof when read in conjunction with the accompanying drawings wherein the same reference numerals denote like or similar parts throughout the several views.

FIGS. 1A and 1B are a plan view and a front view, respectively, of a piezoelectric actuator as an embodiment of the present invention;

FIGS. 3A and 3B are control tables indicating voltages applied to a first and a second pair of piezoelectric elements, respectively, of the actuator;

FIGS. 8A and 8B are a plan view and a front view, respectively, of a piezoelectric actuator as a first modification;

FIGS. 10A and 10B are a plan view and a front view, respectively, of a piezoelectric actuator as a third modification;

DETAILED DESCRIPTION OF THE INVENTION

EMBODIMENT

Figure 2:
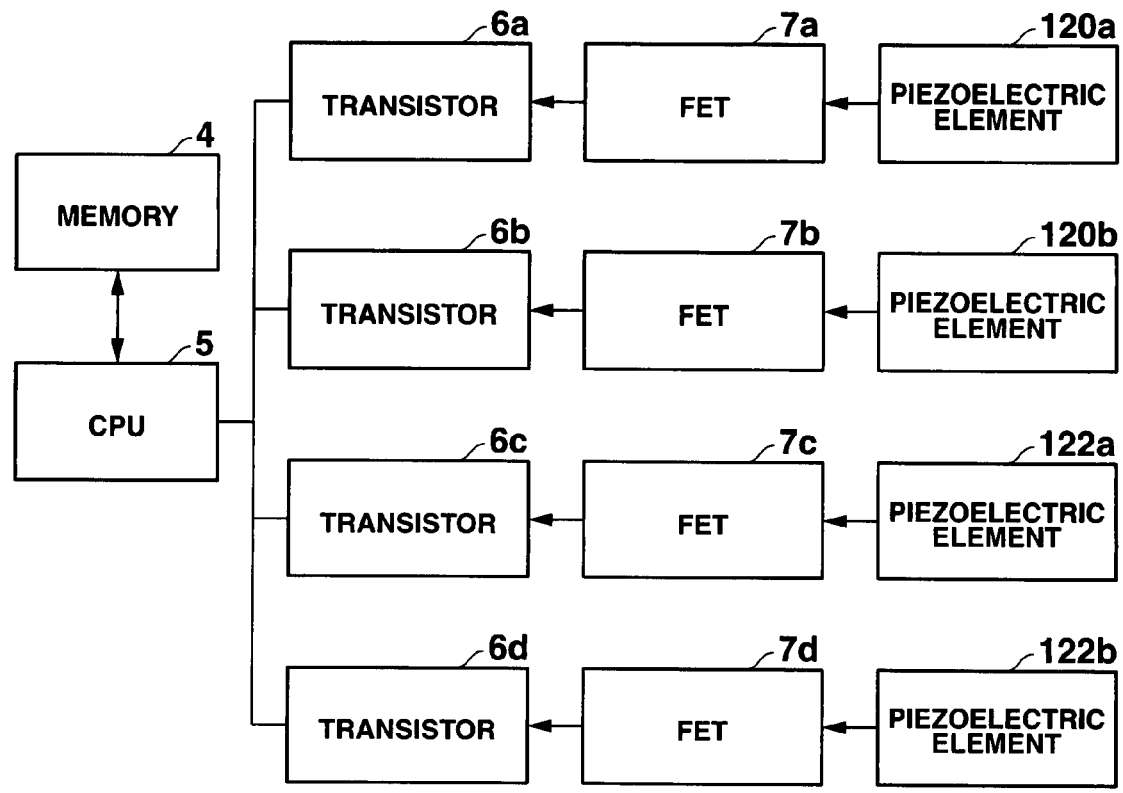
FIG. 2 is a block diagram of an electric circuit of the actuator.

Referring to FIGS. 1A and 1B, a piezoelectric actuator 11 as an embodiment of the present invention comprises a square elastic metal plate 2, which has a protrusion 3 of a square cross section on the center of an upper surface 2a thereof. A first pair of strip-like piezoelectric elements 120a and 120b each are attached by a conductive adhesive to a lower surface 2b of the metal plate 2 so as to extend along a horizontal straight line passing through the center of the plate on a respective one of opposite sides of the center of the plate such that each piezoelectric element extends to a corresponding outer peripheral side of the plate 2. A second pair of piezoelectric elements 122a and 122b are similarly attached to the lower surface of the metal plate 2 so as to extend along a vertical straight line passing through the center of the metal plate 2 perpendicular to the horizontal straight line along which the first pair of piezoelectric elements extend. A voltage is applied across each piezoelectric element and the metal plate 2 for causing the element to deviate, as will be described in greater detail later. The metal plate 2 is supported at its four corners by corresponding forward, backward, right and left poles 8FR, 8Fl, 8BR and 8BL.

As shown in FIG. 2, the electric circuit of the actuator comprises a memory 4 that has stored programs according to which a CPU 5 performs required processing, thereby controlling transistors 6a-6d and FETs 7a-7d so as to apply voltages to the four piezoelectric elements 120a, 120b; 122a, 122b of the first and second pairs. The memory 4 has also stored a table 4a indicating voltages to be applied to the first pair of piezoelectric elements 120a and 120b at predetermined intervals of time, and a table 4b indicating voltages to be applied to the second pair of piezoelectric elements 122a and 122b at predetermined intervals of time, respectively, as shown in FIGS. 3A and 3B. In FIGS. 3A and 3B, "0" represents that the applied voltage is zero and "−" and "+" represent that the applied voltages have minus and plus signs, respectively.

As shown in FIG. 1, in the following description the four piezoelectric elements 120a, 120b and 122a, 122b of the first and second pairs can be hereinafter referred to as left, right, forward and backward piezoelectric elements, respectively.

Figure 4A:
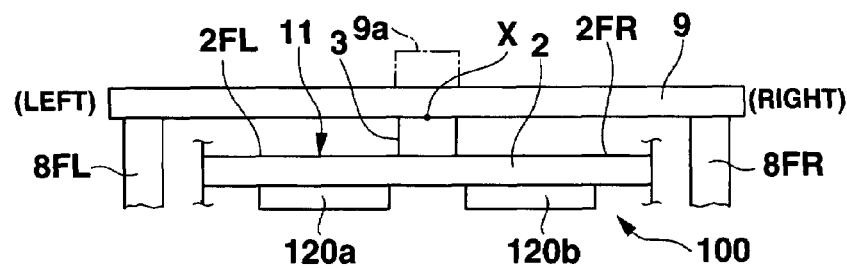
FIGS. 4A-4F illustrates a series of operations of the actuator based on its first pair of piezoelectric elements.

As shown in FIG. 4A and FIG. 1, the metal plate 2 of the actuator 11 is supported at the forward right and left end portions thereof 2FR and 2FL by corresponding forward right and left poles 8FR and 8FL, respectively, and also at the backward right and left end portions thereof 2BR and 2BL by corresponding backward right and left poles 8BR and 8BL, respectively. The protrusion 3 is in contact with an overlying object 9 to be conveyed. Note that FIG. 4 shows only the first pair of piezoelectric elements 120a and 120b and that FIG. 5 shows only the second pair of piezoelectric elements 122a and 122b.

In operation, when a zero voltage is applied to both the piezoelectric elements 120a and 120b of the first pair in accordance with a voltage combination (1) of the FIG. 3A table, the first pair of piezoelectric elements 120a and 120b remain flat as shown in FIG. 4A. Thus, the metal plate 2 also remains flat with the projection 3 abutting on the lower surface of the object 9.

Figure 4B:
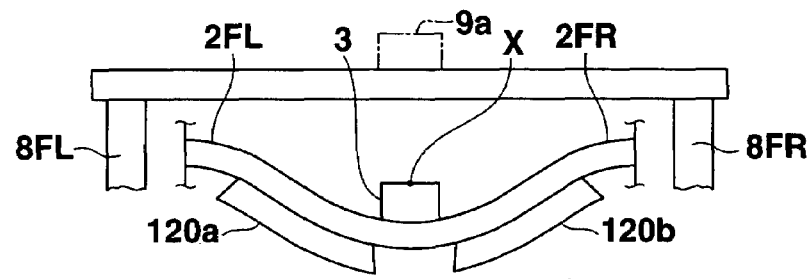

When −V is applied to both the piezoelectric elements 120a and 120b in accordance with a voltage combination (2) of the FIG. 3A table, they extend as shown in FIG. 4B. Thus, the metal plate 2 extends convex downwardly and the projection 3 moves downward away from the object 9.

Figure 4C:
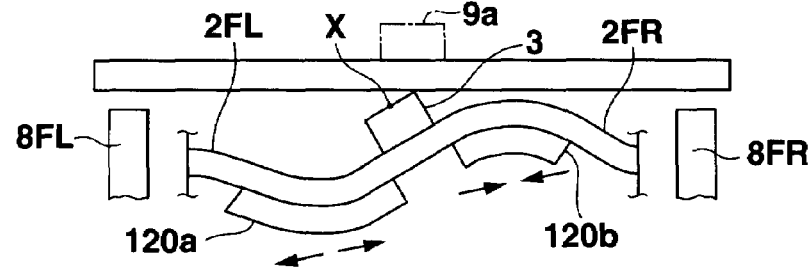

When −V and +V are applied to the piezoelectric elements 120a and 120b, respectively, in accordance with a voltage combination (3) of the FIG. 3A table, the piezoelectric elements 120a and 120b extend and contract, respectively, as shown in FIG. 4C. Thus, the piezoelectric element 120a and 120b sides of the metal plate 2 extend convex downwardly and upwardly, respectively, and hence the metal plate 2 is deformed wavy. The projection 3 is inclined leftward while being displaced upwardly so as to abut at its upper right-hand end 3a on the lower surface of the object 9, thereby pushing up the object 9 higher than the poles 8FR, 8BR, 8FL and 8BL.

Figure 4D:
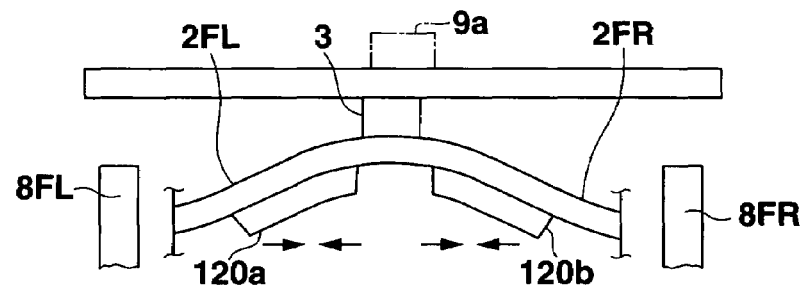

When +V is then applied to both the piezoelectric elements 120a and 120b in accordance with a voltage combination (4) of the FIG. 3A table, these elements both contract as shown in FIG. 4D. Thus, the metal plate 2 extends convex upwardly and the projection 3 becomes upstanding with the object 9 pushed up higher than the poles 8FR, 8BR, 8FL and 8BL, and with the top 3b of the projection 3 abutting on the lower surface of the object 9.

Figure 4E:
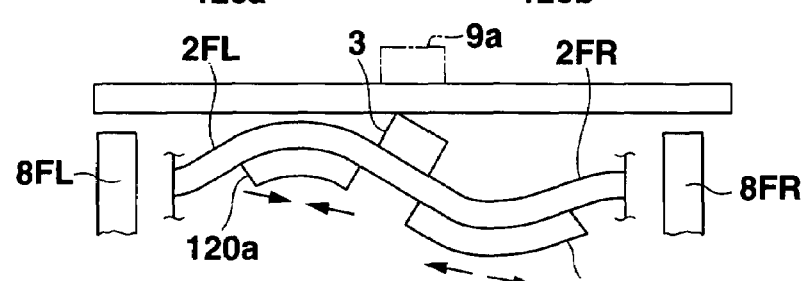

When +V and −V are applied to the piezoelectric elements 120a and 120b, respectively, in accordance with a voltage combination (5) of the FIG. 3A table, the piezoelectric elements 120a and 120b contracts and extend, respectively, as shown in FIG. 4E. Thus, the piezoelectric element 120a and 120b sides of the metal plate 2 extend convex upwardly and downwardly, respectively. The projection 3 is inclined rightward with its upper left end 3c lifting the object 9, thereby conveying the object 9 from left to right.

Figure 4F:
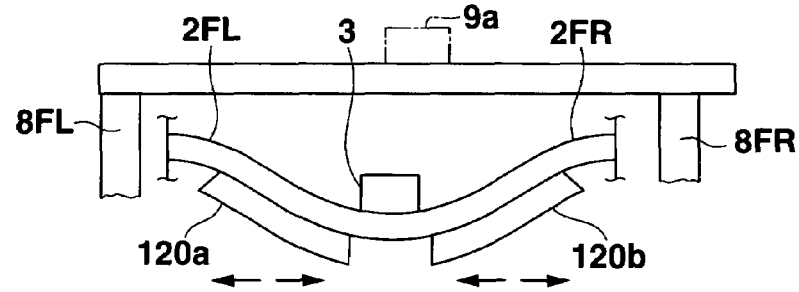

When −V is applied to both the piezoelectric elements 120a and 120b in accordance with a voltage combination (6) of the FIG. 3A table, these elements extend as shown in FIG. 4F. Thus, the metal plate 2 extends convex downwardly and the projection 3 moves downward away from the lower surface of the object 9.

Figure 6:
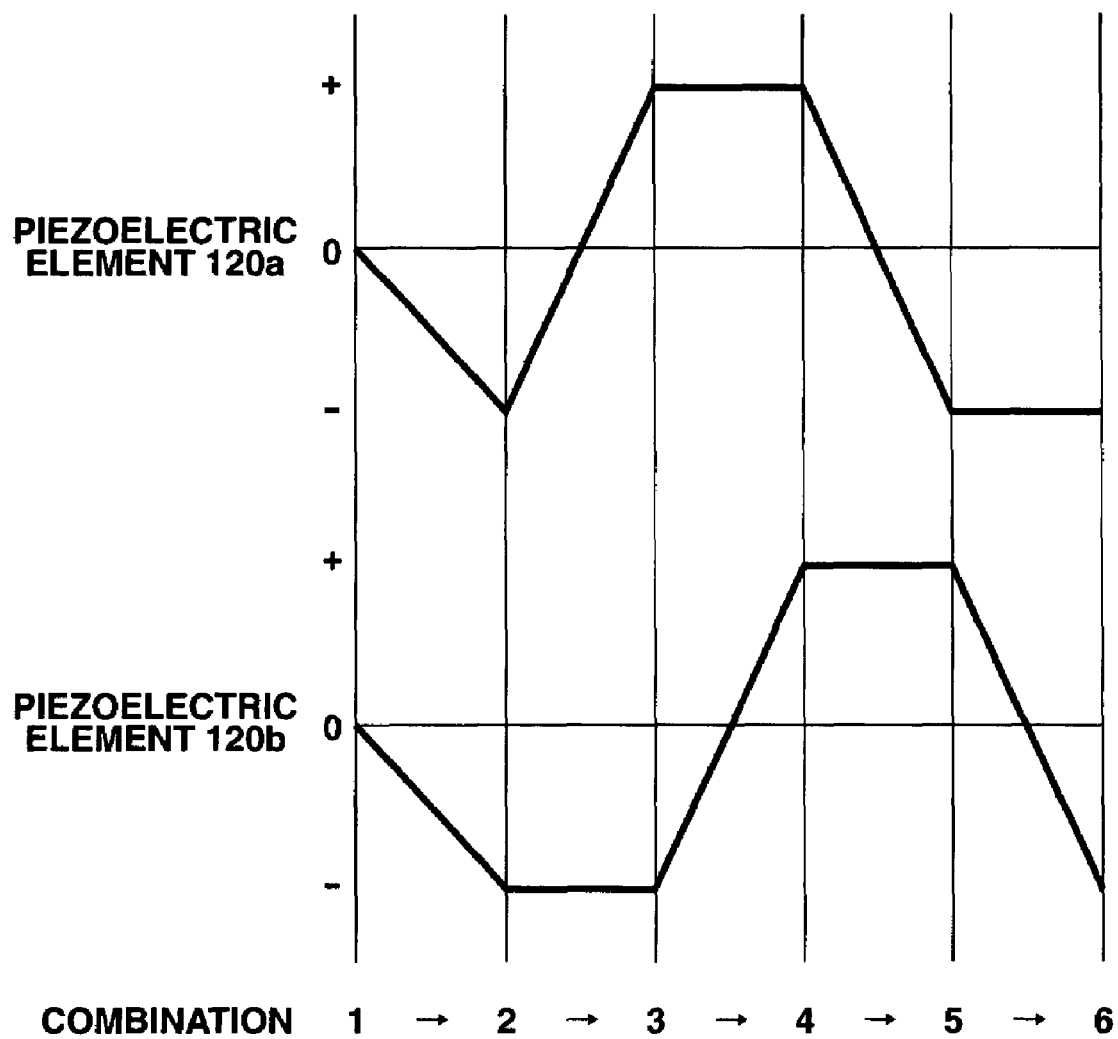
FIG. 6 shows waveforms of voltages applied to the respective piezoelectric elements of the first pair based on the control table of FIG. 3A.
Figure 7:
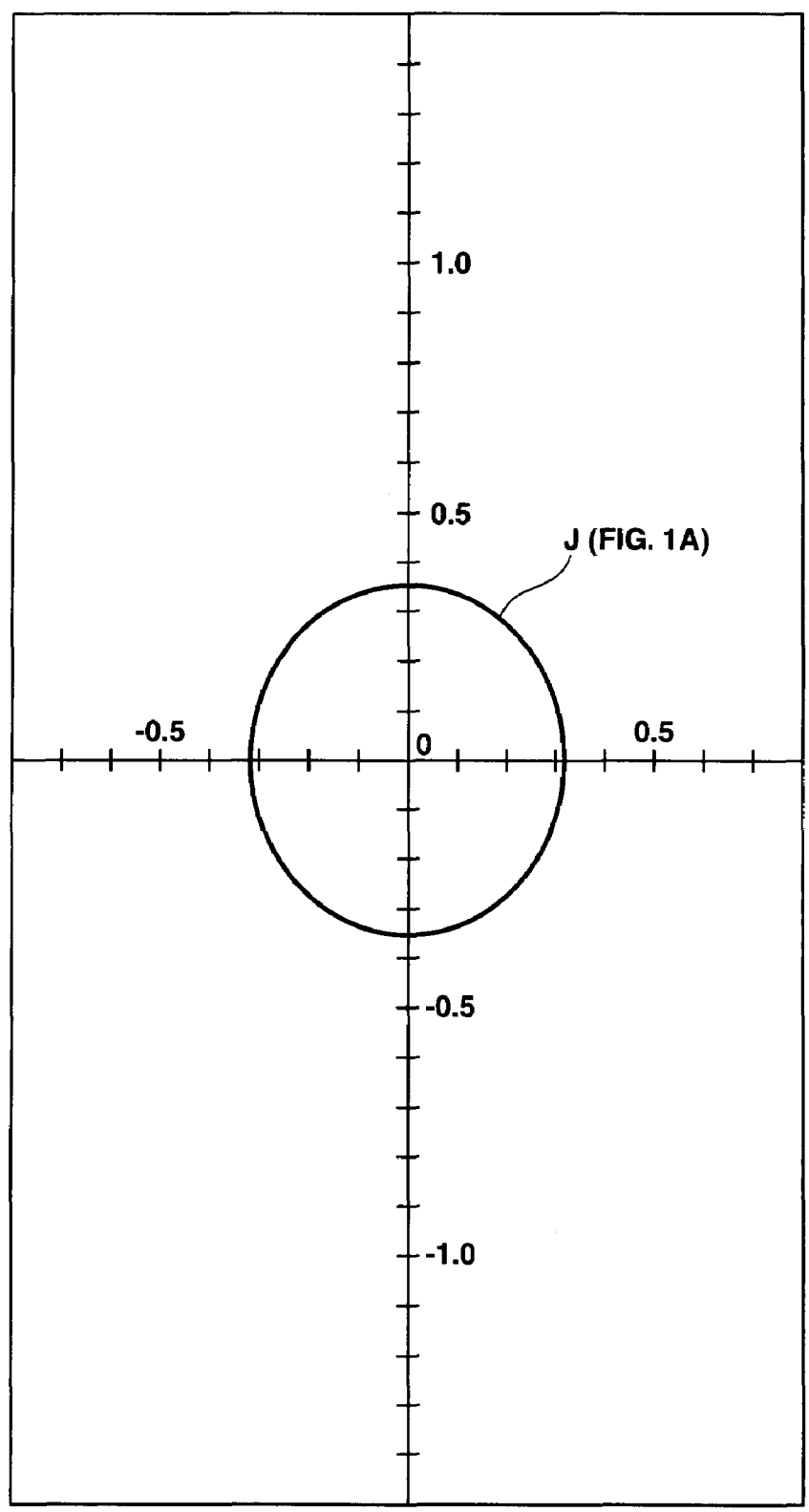
FIG. 7 shows a locus of movement of a point X on a projection provided on a plate of the actuator of FIGS. 4A-4F.

Therefore, as shown in FIG. 6, when voltages are applied cyclically to the first pair of piezoelectric elements 120a and 120b in a sequence of combination (1)→(2)→(3)→(4)→(5)→(6), the projection 3 makes clockwise elliptical motions in a vertical plane, thereby conveying the object 9 rightward. Conversely, when voltages are applied cyclically to the elements 120a and 120b in a sequence of combination (6)→(5)→(4)→(3)→(2)→(1), the projection 3 makes counterclockwise elliptical motions in the vertical plane, as shown by a locus of movement J of a point X thereon in FIG. 7, thereby conveying the object 9 leftward.

Figure 5A:
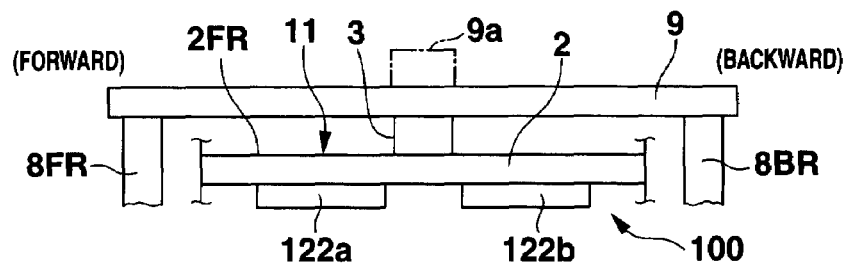
FIGS. 5A-5F illustrates a series of operations of the actuator based on its second pair of piezoelectric elements.

When the voltage applied to the piezoelectric elements 122a and 122b of the second pair is 0 in accordance with a voltage combination (11) of the FIG. 3B table, these piezoelectric elements remain flat as shown in FIG. 5A. Thus, the metal plate 2 also remains flat with the projection 3 abutting on the lower surface of the object 9

Figure 5B:
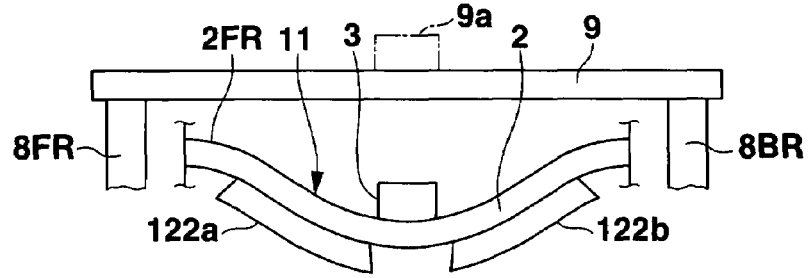

When −V is applied to both the piezoelectric elements 122a and 122b in accordance with a voltage combination (12) of the FIG. 3B, they both extend as shown in FIG. 5B. Thus, the metal plate 2 extends convex downwardly and the projection 3 moves downward away from the object 9.

Figure 5C:
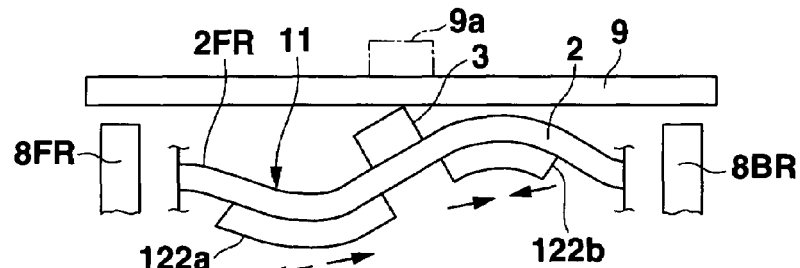

When −V and +V are applied to the piezoelectric elements 122a and 122b, respectively, in accordance with a voltage combination (13) of the FIG. 3B table, the piezoelectric elements 122a and 122b extend and contract, respectively, as shown in FIG. 5C. Thus, the piezoelectric element 122a and 122b sides of the metal plate 2 extend convex downwardly and upwardly, respectively, and hence the metal plate 2 is deformed wavy. Thus, the projection 3 is inclined forward while being displaced upwardly so as to abut at its upper rear edge 3c on the lower surface of the object 9, thereby pushing the object 9 higher than the poles 8FR, 8FL, 8BR and 8BL.

Figure 5D:
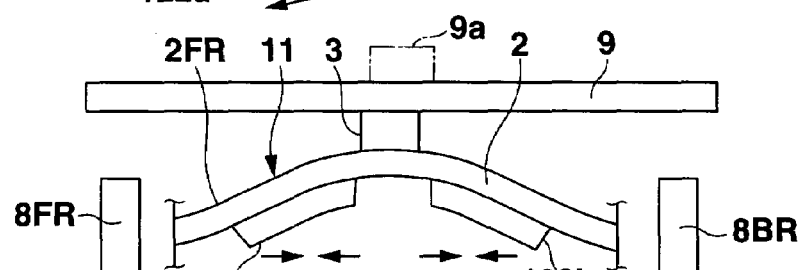

When +V is applied to both the piezoelectric elements 122a and 122b in accordance with a voltage combination (14) of the FIG. 3B table, these elements together contract as shown in FIG. 5D. Thus, the metal plate 2 extends convex upwardly and the projection 3 becomes upstanding with the object 9 pushed up higher than the poles 8FR, 8FL, 8BR and 8BL, thereby causing the top 3b of the projection 3 abutting on the lower surface of the object 9.

Figure 5E:
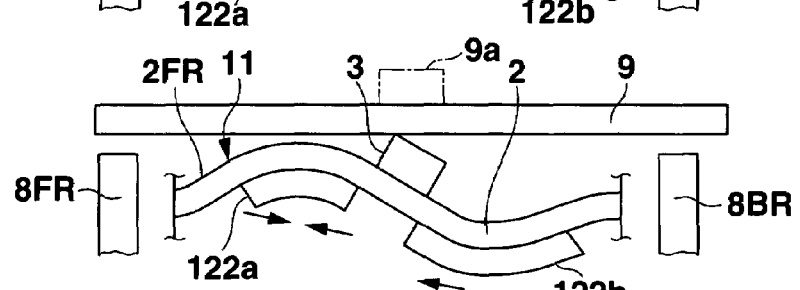

When +V and −V are applied to the piezoelectric elements 122a and 122b, respectively, in accordance with a voltage combination (15) of the FIG. 3B table, the piezoelectric elements 122a and 122b extend convex upwardly and downwardly, respectively, as shown in FIG. 5E. Thus, the piezoelectric element 122a and 122b sides of the metal plate 2 extend convex upwardly and downwardly, respectively, thereby deforming the metal plate 2 wavy. Thus, the projection 3 is inclined backwardly while pushing up the object 9 with an upper edge 3e thereof, and hence the object 9 is conveyed from forward to backward.

Figure 5F:
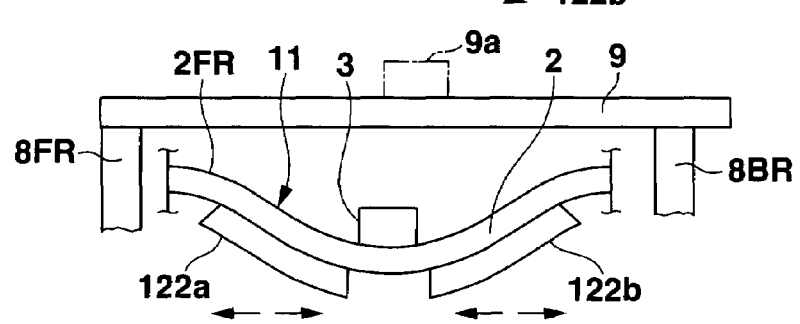

When −V is applied to both the piezoelectric elements 122a and 122b in accordance with a voltage combination (16) of the FIG. 3B table, these elements both extend as shown in FIG. 5F. Thus, the metal plate 2 extends convex downward and the projection 3 moves downward away from the lower surface of the object 9.

Thus, as in FIG. 6, when voltages are applied cyclically to the piezoelectric elements 122a and 122b in a sequence of combination (11)→(12)→(13)→(14)→(15)→(16) in the control table 4b of FIG. 3B, the projection 3 makes clockwise elliptical motions in a vertical plane, thereby conveying the object 9 rightward. Conversely, when voltages are applied to the elements 122a and 122b in a sequence of combination (16)→(15)→(14)→(13)→(12)→(11), the projection 3 makes counterclockwise elliptical motions in the vertical plane. As a result, the object 9 is conveyed from backward to forward.

Briefly, according to the actuator 11, the object can be conveyed in the following respective directions:
(a) rightward in a sequence of combination (1)→(2)→(3)→(4)→(5)→(6);
(b) leftward in a sequence of combination (6)→(5)→(4)→(3)→(2)→(1);
(c) backward in a sequence of combination (11)→(12)→(13)→(14)→(15)→(16); and
(d) forward in a sequence of combination (16)→(15)→(14)→(13)→(12)→(11).

Thus, by selectively combining conveyance forces in these directions (a)-(d), the object 9 can be moved in any direction from the center of the plate 2 in a plane. Assume now that the object 9 may be, for example, a printed circuit board or a support for an image capturing element such as a CCD 9A of a digital camera. In this case, voltages depending on a detected quantity and direction of shake of the image capturing unit can be applied to the first and second pairs of piezoelectric elements of the actuator 11 to drive the image capturing unit so as to correct a shake of an image to be captured in the camera. That is, a shake correction mechanism is provided.

(First Modification)

FIGS. 8A and 8B are a plan view and a front view of a piezoelectric actuator 12 as a second modification. The actuator 12 has the same structure as the embodiment excluding that the projection 31 has a circular cross section.

Thus, like the embodiment, by changing the applied voltages and combining the conveyance forces in the direction (a)-(d) selectively also in this modification, an object 9, which may also be a printed circuit board or a support for a CCD 9A for a digital camera can be moved in any direction from the center of the plate 2 in a plane. According to this modification, since the projection 31 has the circular cross section, states where the projection 31 that is inclined in any direction comes into contact with the object 9 at the upper edge thereof are the same, as shown in FIG. 4 C or 4 E or FIG. 5C or 5 E. That is, the object 9 can be conveyed or moved smoothly in any directions from the center of the plate 2 in the plane because the state where the circular cross section projection 31 is in contact with the object 9 does not change depending on the inclined direction of the projection 31 unlike the square-cross sectional projection 3 whose contact with the object 9 changes depending on an inclined direction of the square cross-sectional projection 31.

(Second modification)

Figure 9A:
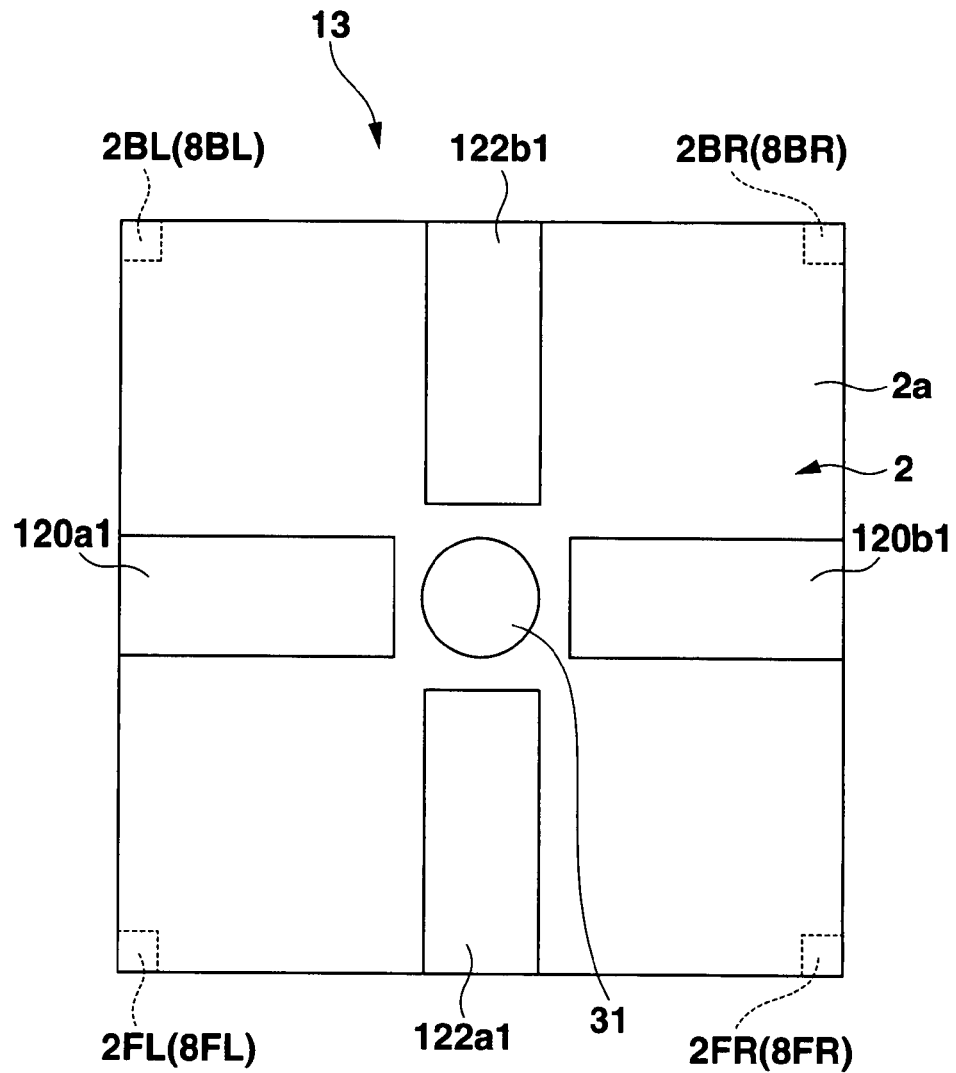
FIGS. 9A and 9B are a plan view and a front view, respectively, of a piezoelectric actuator as a second modification.
Figure 9B:
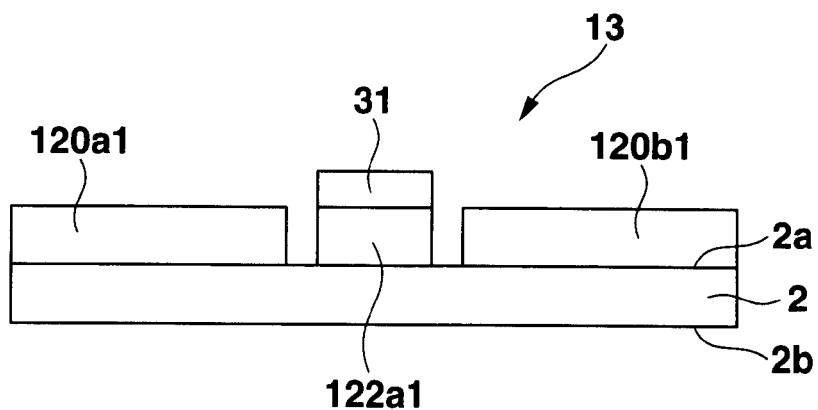

FIGS. 9A and 9B are a plan view and a front view, respectively, of a piezoelectric actuator 13 as a second modification. The actuator 13 has the same structure as the first modification, excluding that a first pair of piezoelectric elements 120a1 and 120b1 are provided on the upper surface 2a of the metal plate 2, where the projection 31 is provided, so as to intersect with a second pair of piezoelectric elements 122a1 and 122b1 at right angles at the position of the projection 31.

The thickness of the actuator 13 is equal to the sum of the thickness of the metal plate 2 and the height of the projection 31. Thus, the actuator of this modification is thinner than the actuator 11 or 12 of the embodiment or first modification.

(Third Modification)

FIGS. 10A and 10B are a plan view and a front view, respectively, of a piezoelectric actuator 14 as a third modification. The actuator 14 has the same structure as the first modification, excluding that additional first and second pairs of piezoelectric elements 120a1, 120b1 and 122a1, 122b1 such as are shown in FIGS. 9A and 9B are also provided on the upper surface 2a of the metal plate 2 so as to correspond in position to those provided on the lower surface of the metal plate 2.

Thus, according to the actuator 14, the metal plate 2 is deformed based on extension and contraction and vice versa of the corresponding upper and lower piezoelectric elements of the respective pairs. Thus, the quantity and force of deformation of the metal plate 2 increase, thereby increasing a quantity and force of change of the projection 31.

(Variations of the Third Modification)

Figure 11A:
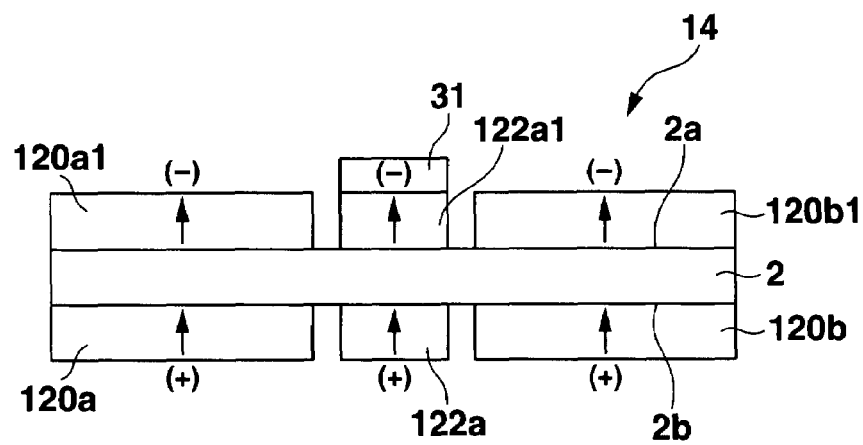
FIGS. 11A and 11B each are a front view of a piezoelectric actuator as a different variation of the third modification.
Figure 11B:
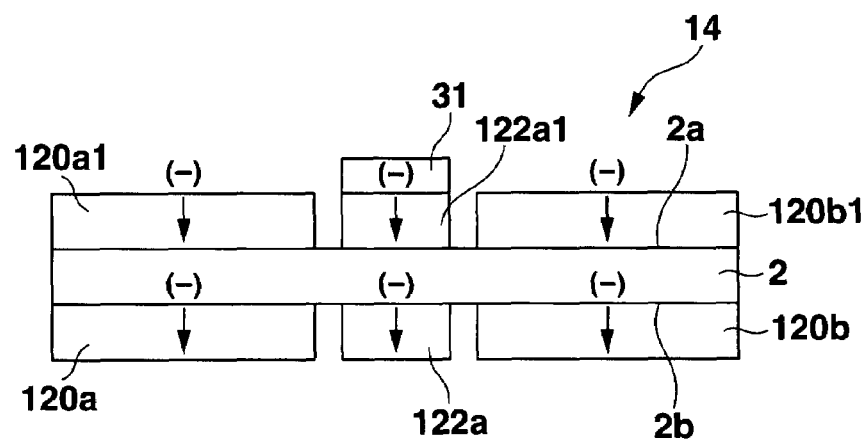

FIGS. 11A and 11B each are a variation of the third modification. This actuator 14 has the same configuration as that of the third modification, but each piezoelectric element has a polarity and the direction in which the element extends/contracts varies depending on the direction in which electric charges are applied. In FIGS. 11A and 11B, an arrow indicates a polarity of each piezoelectric element. When electric charges are applied to the elements in the direction of an arrow, the elements contract whereas when electric charges are applied to the elements in the reverse direction, the element extend. In FIG. 11A, the upper and lower corresponding piezoelectric elements 120a1 and 120a are arranged such that their polarities are opposite in direction. This applies to the other upper and lower corresponding piezoelectric elements. In FIG. 11B, the upper and lower corresponding piezoelectric elements 120a1 and 120a are arranged such that their polarities are the same in direction. This applies to the other upper and lower corresponding piezoelectric elements.

In order to extend the metal plate 2 convex upwardly in FIG. 11A, the upper piezoelectric elements 120a1, 120b1; 122a1 and 122b1 must be extended and the corresponding lower piezoelectric elements 120a, 120b, 122a and 122b must be contracted. To this end, minus and plus electric charges must be applied to the upper and lower corresponding piezoelectric elements, respectively. That is, electric charges of different polarities must be applied to the upper and lower corresponding piezoelectric elements. Thus, a control circuit is required for applying required switching voltages to the upper and lower corresponding piezoelectric elements.

In the case of the variation of FIG. 11B, when minus electric charges are applied to both the upper and lower corresponding piezoelectric elements 120a1, 120a; 120b1, 120b; 122a1, 122a; and 122b1, 122b, these elements are extended and contracted, respectively. That is, electric charges of the same polarity are required to be applied to the upper and lower corresponding piezoelectric elements, which therefore can share the same control circuit. This allows the structure of the control circuit to be simplified.

(Fourth Modification)

Figure 12:
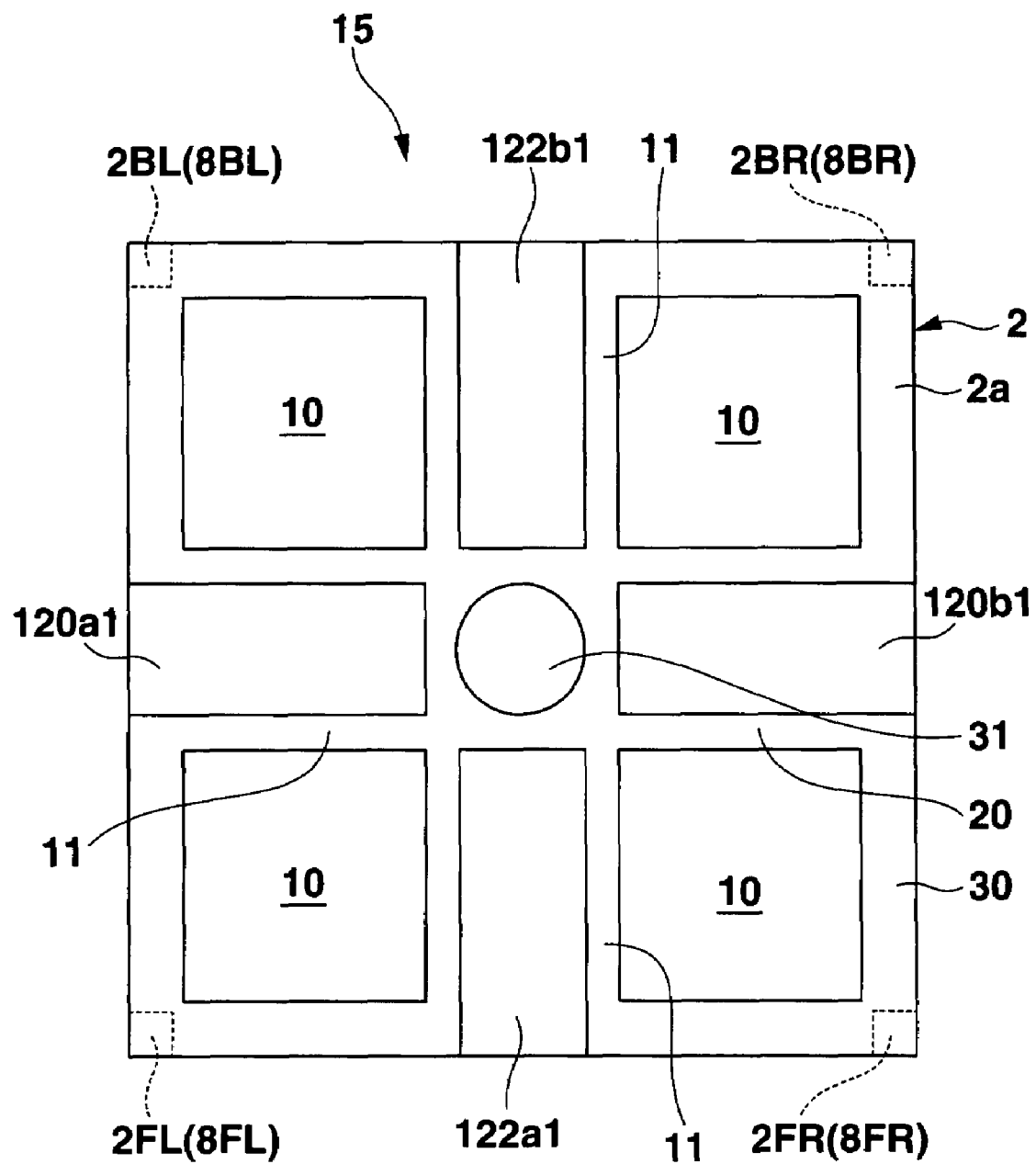
FIG. 12 is a plan view of a piezoelectric actuator as a fourth modification.

FIG. 12 is a plan view of a piezoelectric actuator 15 as a fourth modification. The actuator 15 has the same structure as the FIG. 9 second modification, excluding that the metal plate 2 has four square openings 10 each between adjacent perpendicularly arranged piezoelectric elements (for example 120a1 and 122b1) of the first and second pairs such that an area for each piezoelectric element acts as a bridge 20 integral at one end with a central area for the projection 31 and at the other end with a frame 30 forming the outer periphery of the metal plate 2.

When the metal plate 2 has no openings such as 10, as in the second modification, the whole metal plate 2 must be deformed by extensions/contractions of the piezoelectric elements. Thus, resistance to deformation of the whole metal plate 2 is high, thereby hindering a displacement of the projection 31 greatly. In contrast, in the present modification, only the bridges 20 of the metal plate 2 are deformed by extensions/contractions of the piezoelectric elements and hence resistance to the deformation is reduced. Thus, voltages applied to the piezoelectric elements are reduced while the projection 31 is greatly displaced.

(Fifth Modification)

Figure 13A:
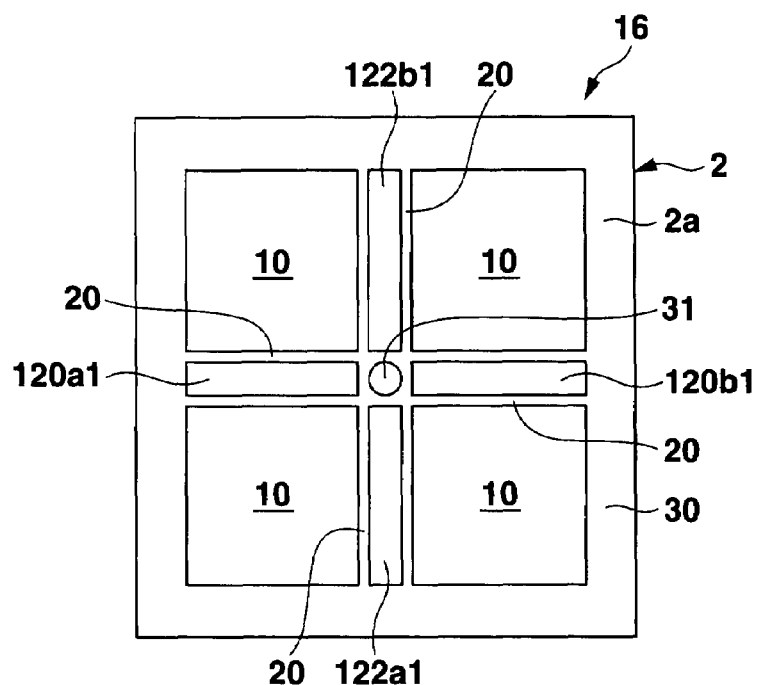
FIGS. 13A, 13B and 13C are a plan view, a front view and a bottom view of a piezoelectric actuator as a fifth modification.
Figure 13B:
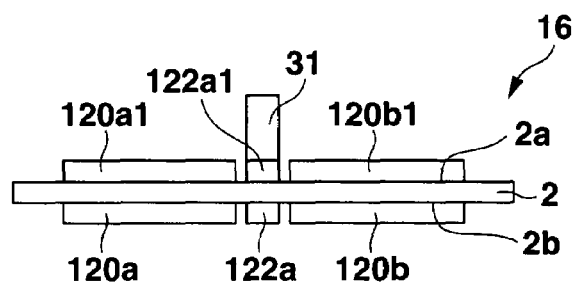
Figure 13C:
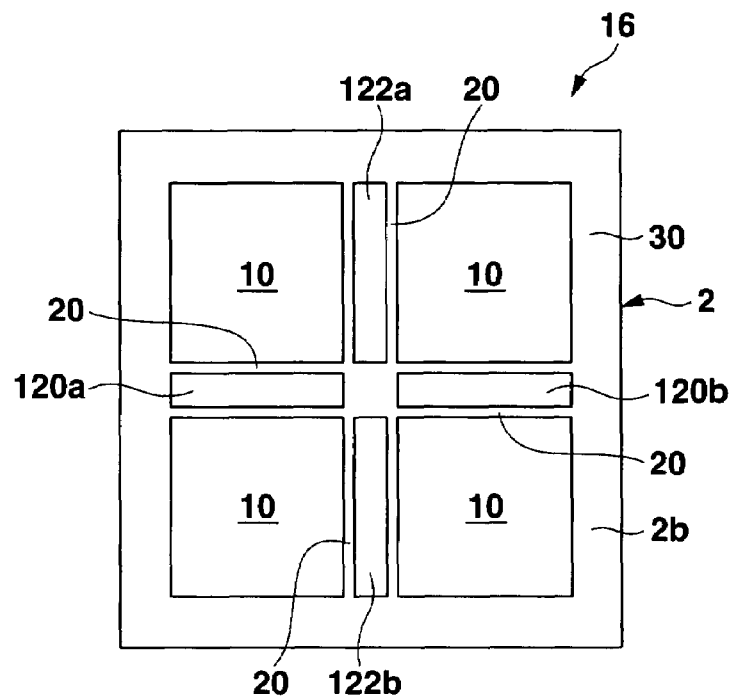

FIGS. 13A, 13B and 13C are a plan view, a front view and a bottom view of a piezoelectric actuator 16 as a fifth modification. The actuator 16 comprises a combination of the fourth modification of FIG. 12 and the first and second pairs of piezoelectric elements 120a, 120b and 122a, 122b disposed on the lower surface of the metal plate 2 so as to correspond in position to the additional first and second pairs of piezoelectric elements 120a1, 120b1 and 122a1, 122b1 disposed on the upper surface of the metal plate 2.

Figure 14A:
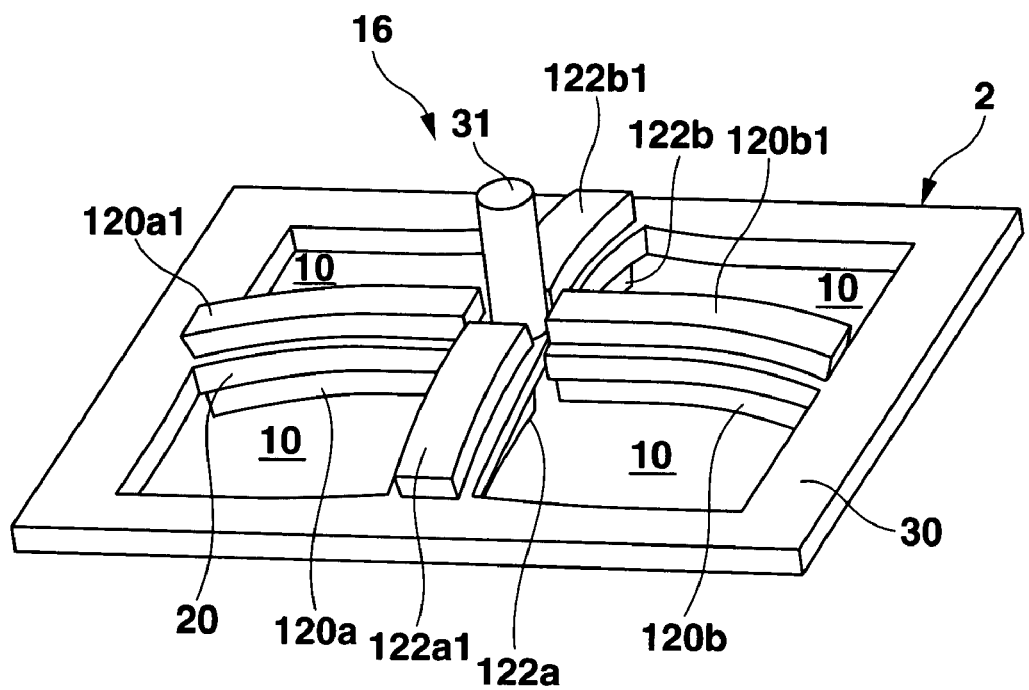
FIGS. 14A and 14B each show a different operative state of the piezoelectric actuator.
Figure 14B:
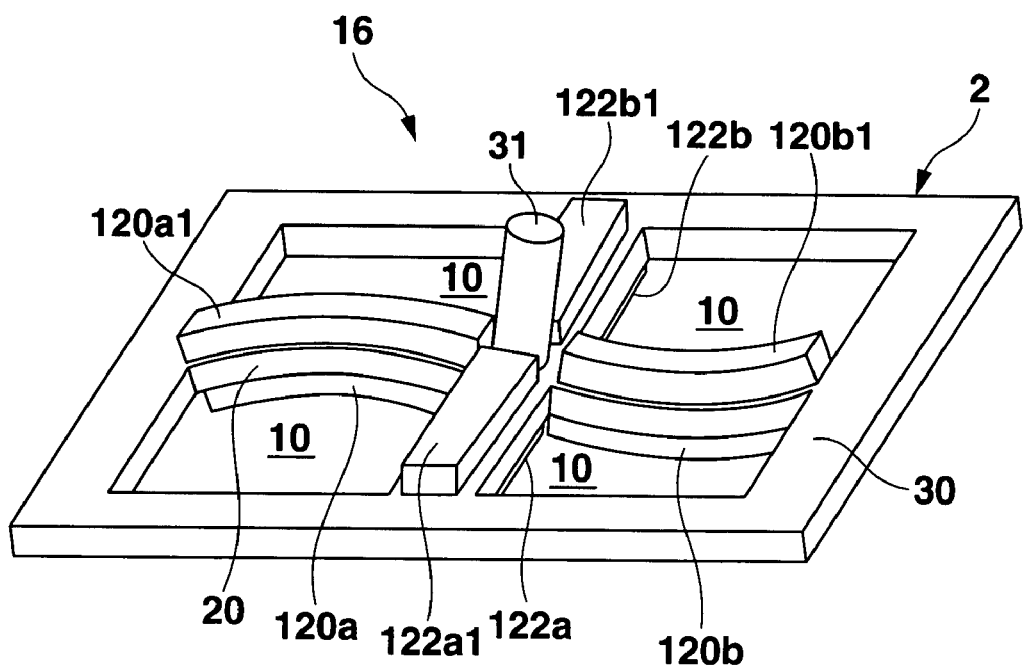

When the upper piezoelectric elements 120a1, 120b1; 122a1, 122b1 are extended and the lower piezoelectric elements 120a, 120b; 122a, 122b are contracted, as shown in FIG. 14A, only the bridges 20 on which these upper and lower piezoelectric elements are disposed are deformed convex upwardly, thereby displacing the projection 31 upwardly. As shown in FIG. 14B, when the upper and lower corresponding piezoelectric elements 120a1 and 120a are extended and contracted, respectively, and the upper and lower corresponding piezoelectric elements 120b1 and 120b are contracted and extended, respectively, only their bridges 20 are correspondingly deformed, thereby inclining the projection 31. That is, when the upper and lower corresponding piezoelectric elements 120a1 and 120a; 120b1 and 120b; 122a1 and 122a; and 122b1 and 122b are extended or contracted, only the bridges 20 of the metal plate 2 are deformed and hence resistance to the deformation of the metal plate is reduced. Thus, the voltages applied to the piezoelectric elements are reduced while a displacement of the projection 31 is increased.

In addition, by combining the extensions and contractions of the upper and lower corresponding piezoelectric element 120a1 and 120a; 120b1 and 120b; 122a1 and 122a; and 122b1 and 122b, the corresponding bridges 20 are deformed, thereby increasing their quantities and forces of deformation and hence of the projection 31.

(Sixth Modification)

Figure 15A:
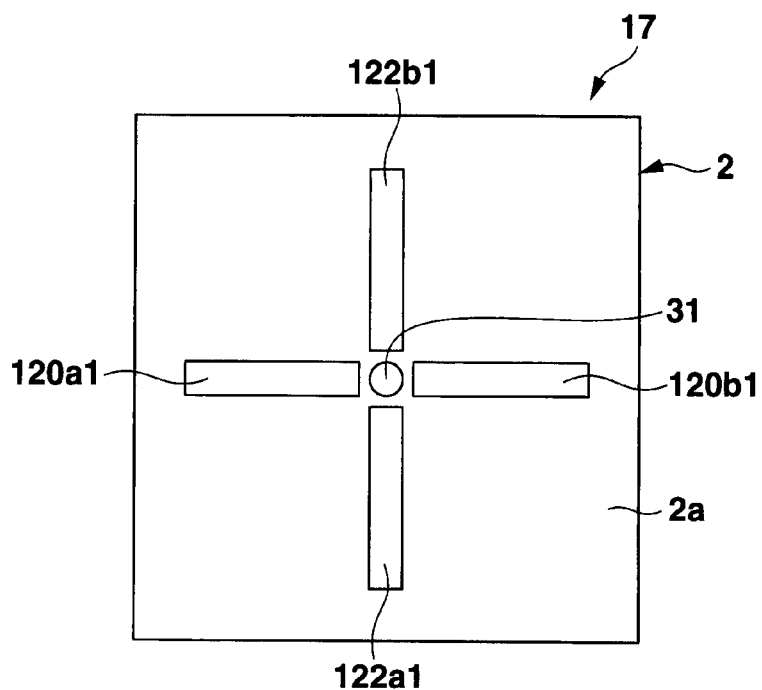
FIGS. 15A, 15B and 15C are a plan view, a front view and a bottom view of a piezoelectric actuator as a sixth modification.
Figure 15B:
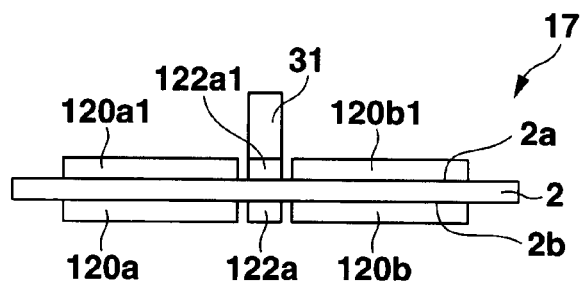
Figure 15C:
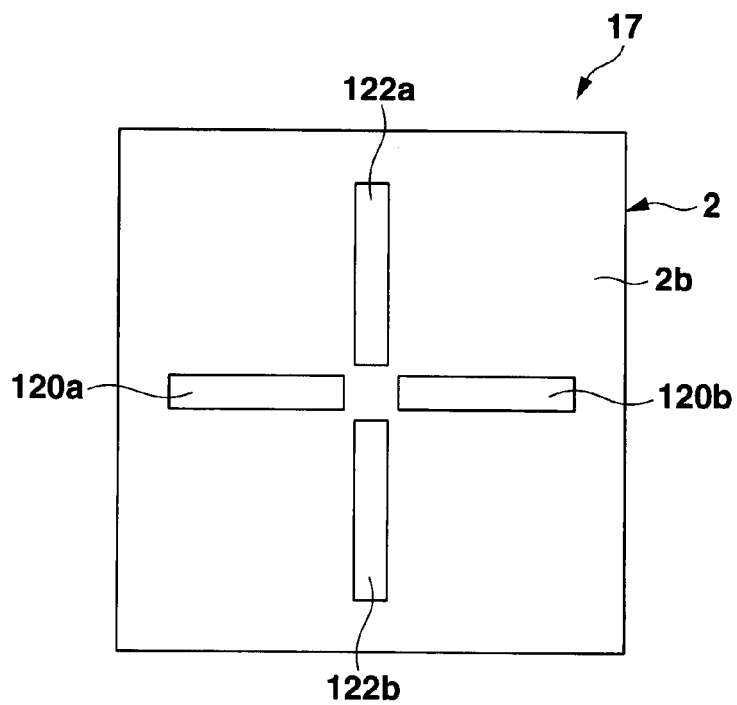

FIGS. 15A, 15B and 15C are a plan view, a front view and a bottom view of a piezoelectric actuator 17 as a sixth modification. This actuator has the same structure as that of the third modification of FIGS. 10A and 10B, excluding that each piezoelectric element has a length which does not reach a corresponding outer periphery of the metal plate 2.

Figure 16A:
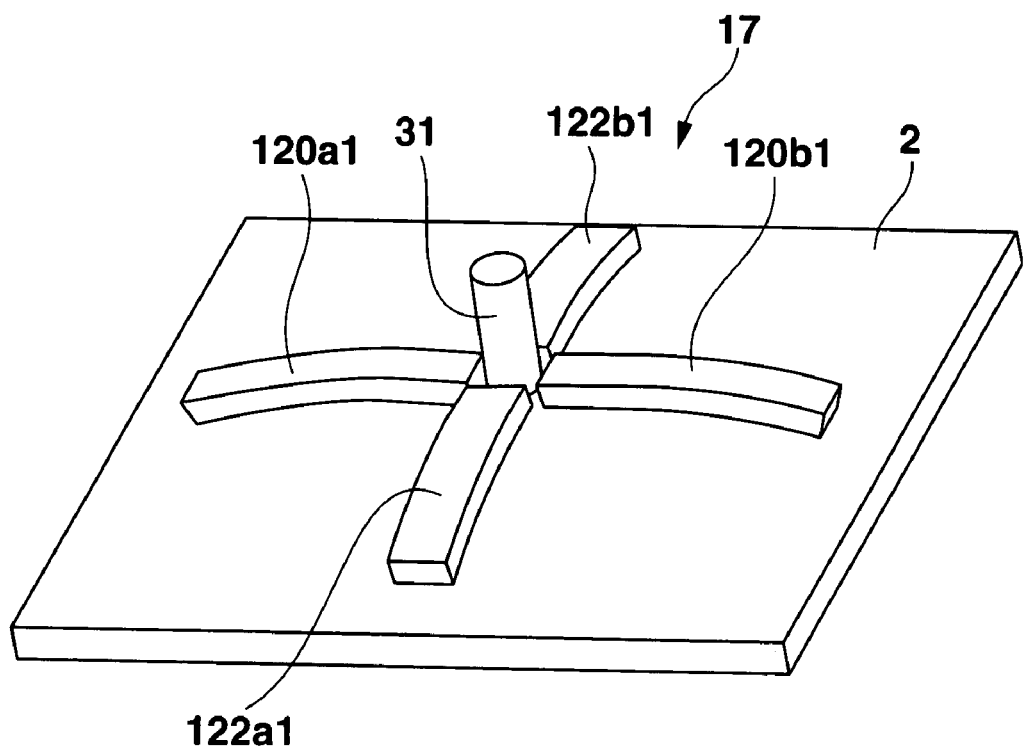
FIGS. 16A and 16B each illustrate a different operation of the actuator as the sixth modification.
Figure 16B:
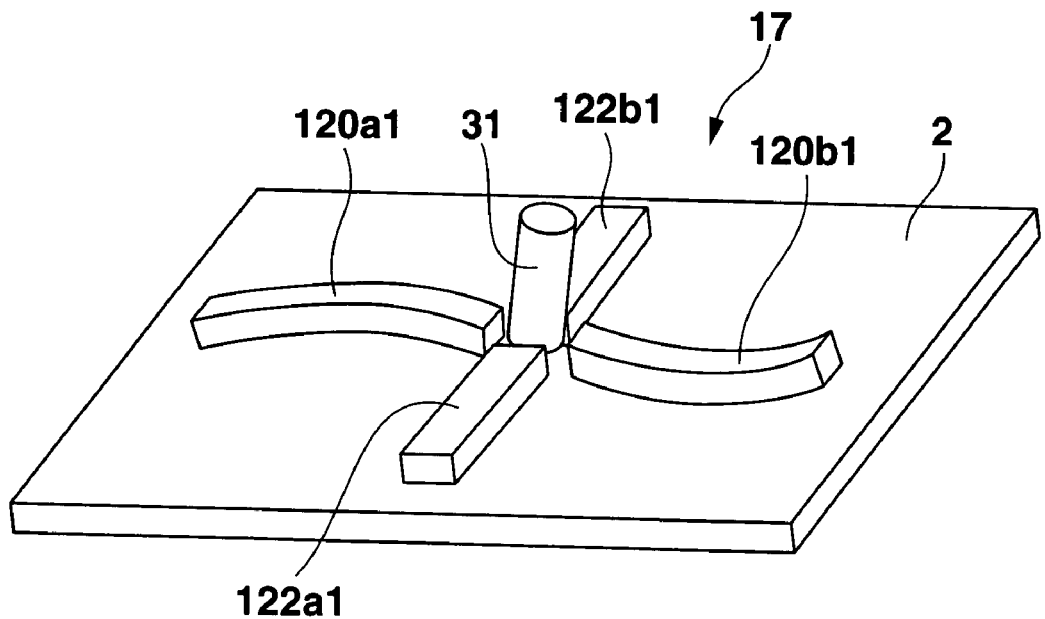

Thus, according to the actuator 17, by extending the upper piezoelectric elements 120a1 and 120b1; 122a1 and 122b1 and contracting the lower piezoelectric elements 120a and 120b; 122a and 122b, the projection 31 is displaced upwardly, as shown in FIG. 16A. By extending and contracting the upper and lower corresponding piezoelectric elements 120a1 and 120a, respectively, and by contracting and extending the upper and lower corresponding piezoelectric elements 120b1 and 120b, respectively, the projection 31 is displaced inclined rightward as shown in FIG. 16B. Since the upper and lower piezoelectric elements have the length which does not reach the corresponding outer periphery of the metal plate 2, the metal plate 2 is not deformed as a whole and resistance to the deformation is high. However, by combining extensions and contractions of all these corresponding piezoelectric elements, the metal plate 2 is deformed. Thus, the projection 31 is sufficiently displaced without hindrance even when resistance to the deformation is high.

The actuator is restored rapidly to its initial state by stopping application of voltages to the upper and lower piezoelectric elements because high resistance of the metal plate 2 is used advantageously.

While in the sixth modification the piezoelectric elements are illustrated as provided on both the upper and lower surfaces of the metal plate 2, they may be provided only on one of the upper and lower surfaces of the metal plate 2. While the square openings 10 are illustrated as provided in the metal plate, the openings 10 may take another form. Further, the actuator according to the present invention can be used to move or convey various other objects in addition to the image capturing element, for example, the CCD of the digital camera.

SUMMARY OF EMBODIMENT AND MODIFICATIONS

A piezoelectric actuator comprises: an elastic plate (2); a projection (3) provided on one of both surfaces (2a, 2b) of the plate; a first pair of strip-like piezoelectric elements (120a, 120b (120a1, 120b1)) fixed to at least one of both the surfaces of the plate so as to extend along a straight line passing through the position of the projection on the plate such that each of the first pair of piezoelectric elements is disposed on a respective one of opposite sides of the position of the projection; and a second pair of strip-like piezoelectric elements (122a, 122b (122a1, 122b1)) disposed so as to extend along a second straight line perpendicular to the first straight line, whereby different predetermined voltages are applied to the respective piezoelectric elements of the first and second pairs so as to deform the plate, thereby causing the projection to deviate.

According to the actuator, when first respective predetermined voltages are applied to the first pair of piezoelectric elements, these respective elements are extended and/or contracted, thereby deviating the projection in a first direction in a plane which intersects with the projection. When second respective predetermined voltages are applied to the second pair of piezoelectric elements, these respective elements are extended and/or contracted, thereby causing the projection to deviate in a second direction perpendicular to the first direction. A combination of deviations of the projection in the first and second directions enables the projection to deviate in any directions in the plane.

The plate is made of a metal.

The first and second pairs of piezoelectric elements are bonded by a conductive adhesive to the metal plate.

The first and second pairs of strip-like piezoelectric elements are disposed on the other of both the surfaces of the plate.

The first and second pairs of strip-like piezoelectric elements are disposed on the one of both the surfaces of the plate on which the projection is provided.

The projection has a square cross section (FIG. 1).

The projection has a circular cross section (3 in FIG. 8).

When the piezoelectric elements of the first and second pairs are fixed to each of both the surfaces of the plate, the piezoelectric elements (120a1, 120b1; 122a1, 122b1) of the first and second pairs fixed to the one surface of the plate correspond in position and arrangement to the piezoelectric elements (120a, 120b; 122a, 122b) of the first and second pairs fixed to the other surface of the plate (FIGS. 10-16).

Each of the piezoelectric elements of the first and second pairs fixed to the one surface of the plate is arranged so as to have the same polarity as a corresponding one of the piezoelectric elements of the first and second pairs fixed to the other surface of the plate.

The plate has an opening (10 in FIGS. 12-14).

The opening is e provided between adjacent ones of the piezoelectric elements of the first and second pairs on the plate.

The present invention also provides a carrier comprising the actuator and a conveyance member to be conveyed depending on a deviation of the projection. As will be obvious from the above, according to the carrier, the combination of deviations of the projection in the first and second directions enables the projection and hence an object of conveyance to deviate and be conveyed, respectively, in any directions in the plane.

The present invention also provides a shake correction apparatus in a camera, comprising the actuator and an image capturing unit that is driven depending on a deviation of the projection. As will be obvious from the above, according to the shake correction apparatus, the combination of deviations of the projection in the first and second perpendicular directions enables the projection and hence the image capturing unit to deviate and be driven, respectively, in any directions in the plane.

Various modifications and changes may be made thereunto without departing from the broad spirit and scope of this invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2006-100183 filed on Mar. 31, 2006 and including specification, claims, drawings and summary. The disclosure of the above Japanese patent application is incorporated herein by reference in its entirety.

What is claimed is:

1. A piezoelectric actuator comprising:
    an elastic plate;
    a projection provided on one of both surfaces of the plate;
    a first pair of strip-like piezoelectric elements fixed to at least one of both the surfaces of the plate so as to extend along a first straight line passing through the position of the projection on the plate such that each of the first pair of piezoelectric elements is disposed on a respective one of opposite sides of the position of the projection; and
    a second pair of strip-like piezoelectric elements disposed so as to extend along a second straight line perpendicular to the first straight line,
    whereby voltages are applied to the respective piezoelectric elements of the first and second pairs so as to deform the plate, thereby causing the projection to deviate.

2. The actuator of claim 1, wherein the plate is made of a metal.

3. The actuator of claim 2, wherein the first and second pairs of piezoelectric elements are bonded by a conductive adhesive to the metal plate.

4. The actuator of claim 1, wherein the first and second pairs of strip-like piezoelectric elements are disposed on the other of both the surfaces of the plate.

5. The actuator of claim 1, wherein the first and second pairs of strip-like piezoelectric elements are disposed on the one of both the surfaces of the plate on which the projection is provided.

6. The actuator of claim 1, wherein the projection has a square cross section.

7. The actuator of claim 1, wherein the projection has a circular cross section.

8. The actuator of claim 1, wherein when the piezoelectric elements of the first and second pairs are fixed to each of both the surfaces of the plate, the piezoelectric elements of the first and second pairs fixed to the one surface of the plate correspond in position and arrangement to the piezoelectric elements of the first and second pairs fixed to the other surface of the plate.

9. The actuator of claim 8, wherein each of the piezoelectric elements of the first and second pairs fixed to the one surface of the plate is arranged so as to have the same polarity as a corresponding one of the piezoelectric elements of the first and second pairs fixed to the other surface of the plate.

10. The actuator of claim 1, wherein the plate has an opening.

11. The actuator of claim 10, wherein the opening is provided in the plate between adjacent ones of the piezoelectric elements of the first and second pairs.

12. A carrier comprising the actuator of claim 1 and a conveyance member to be conveyed depending on a deviation of the projection.

13. A shake correction apparatus in a camera, comprising the actuator of claim 1 and an image capturing unit that is driven depending on a deviation of the projection.

* * * * *